US009633735B2

(12) United States Patent
Kim et al.

(10) Patent No.: US 9,633,735 B2
(45) Date of Patent: Apr. 25, 2017

(54) SYSTEM AND METHOD TO INHIBIT ERASING OF PORTION OF SECTOR OF SPLIT GATE FLASH MEMORY CELLS

(71) Applicant: Silicon Storage Technology, Inc., San Jose, CA (US)

(72) Inventors: Jinho Kim, Saratoga, CA (US); Nhan Do, Saratoga, CA (US); Yuri Tkachev, Sunnyvale, CA (US); Kai Man Yue, Shanghai (CN); Xiaozhou Qian, Shanghai (CN); Ning Bai, Shanghai (CN)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/486,687

(22) Filed: Sep. 15, 2014

(65) Prior Publication Data

US 2016/0027517 A1    Jan. 28, 2016

(30) Foreign Application Priority Data

Jul. 22, 2014  (CN) .......................... 2014 1 0447574

(51) Int. Cl.
| | |
|---|---|
| *G11C 16/04* | (2006.01) |
| *G11C 16/14* | (2006.01) |
| *G11C 16/12* | (2006.01) |
| *G11C 29/02* | (2006.01) |

(52) U.S. Cl.
CPC .......... *G11C 16/14* (2013.01); *G11C 16/0425* (2013.01); *G11C 16/12* (2013.01); *G11C 29/021* (2013.01); *G11C 29/028* (2013.01)

(58) Field of Classification Search
CPC ....... G11C 16/16; G11C 16/14; G11C 16/344; G11C 16/3445; G11C 11/5635; G11C 16/0425; G11C 29/028; G11C 29/021; G11C 16/12; H01L 27/115; H01L 27/11521; H01L 27/11568; H01L 29/42324; H01L 29/66825
USPC ................. 365/185.01, 185.29, 218, 185.33; 257/316, 326
See application file for complete search history.

(56) References Cited

U.S. PATENT DOCUMENTS

| | | | |
|---|---|---|---|
| 5,579,259 A * | 11/1996 | Samachisa ............. | G11C 5/025 257/316 |
| 5,748,538 A | 5/1998 | Lee et al. | |
| 7,046,552 B2 * | 5/2006 | Chen ................... | G11C 16/0425 257/314 |
| 7,598,561 B2 * | 10/2009 | Chen ................... | H01L 29/7885 257/314 |
| 2013/0223148 A1 * | 8/2013 | Seo ........................ | H01L 27/04 365/185.11 |

OTHER PUBLICATIONS

PCT Search Report dated May 8, 2015 corresponding to the related PCT Patent Application No. US2015/35360.

* cited by examiner

*Primary Examiner* — Tha-O H Bui
(74) *Attorney, Agent, or Firm* — DLA Piper LLP (US)

(57) ABSTRACT

A system and method to inhibit the erasing of a portion of a sector of split gate flash memory cells while allowing the remainder of the sector to be erased is disclosed. The inhibiting is controlled by control logic that applies one or more bias voltages to the portion of the sector whose erasure is to be inhibited.

2 Claims, 5 Drawing Sheets

SYSTEM AND METHOD TO INHIBIT ERASING OF PORTION OF SECTOR OF SPLIT GATE FLASH MEMORY CELLS

PRIORITY CLAIM

The present application claims priority under 35 U.S.C. Section 119 to Patent Application 201410447574.3, titled "System and Method to Inhibit Erasing of Portion of Sector of Split Gate Flash Memory Cells" and filed in the People's Republic of China on Jul. 22, 2014, which is incorporated by reference herein.

TECHNICAL FIELD

A system and method to inhibit the erasing of a portion of a sector of split gate flash memory cells while allowing the remainder of the sector to be erased is disclosed.

BACKGROUND OF THE INVENTION

Flash memory cells using a floating gate to store charges thereon and memory arrays of such non-volatile memory cells formed in a semiconductor substrate are well known in the art. Typically, such floating gate memory cells have been of the split gate type, or stacked gate type.

One prior art non-volatile memory cell 10 is shown in FIG. 1. The split gate SuperFlash (SF) memory cell 10 comprises a semiconductor substrate 1 of a first conductivity type, such as P type. The substrate 1 has a surface on which there is formed a first region 2 (also known as the source line SL) of a second conductivity type, such as N type. A second region 3 (also known as the drain line) also of a second conductivity type, such as N type, is formed on the surface of the substrate 1. Between the first region 2 and the second region 3 is a channel region 4. A bit line (BL) 9 is connected to the second region 3. A word line (WL) 8 (also referred to as the select gate) is positioned above a first portion of the channel region 4 and is insulated therefrom. The word line 8 has little or no overlap with the second region 3. A floating gate (FG) 5 is over another portion of the channel region 4. The floating gate 5 is insulated therefrom, and is adjacent to the word line 8. The floating gate 5 is also adjacent to the first region 2. A coupling gate (CG) 7 (also known as control gate) is over the floating gate 5 and is insulated therefrom. An erase gate (EG) 6 is over the first region 2 and is adjacent to the floating gate 5 and the coupling gate 7 and is insulated therefrom. The erase gate 6 is also insulated from the first region 2.

One exemplary operation for erase and program of prior art non-volatile memory cell 10 is as follows. The cell 10 is erased, through a Fowler-Nordheim tunneling mechanism, by applying a high voltage on the erase gate EG 6 with other terminals equal to zero volt. Electrons tunnel from the floating gate FG 5 into the erase gate EG 6 causing the floating gate FG 5 to be positively charged, turning on the cell 10 in a read condition. The resulting cell erased state is known as '1' state. Another embodiment for erase is by applying a positive voltage Vegp on the erase gate EG 6, a negative voltage Vcgn on the coupling gate CG 7, and applying a zero voltages on other terminals. The negative voltage Vcgn couples negatively the floating gate FG 5, hence less positive voltage Vcgp is required for erasing. Electrons tunnel from the floating gate FG 5 into the erase gate EG 6 causing the floating gate FG 5 to be positively charged, turning on the cell 10 in a read condition (cell state '1'). Alternatively, the wordline WL 8 (Vwle) and the source line SL 2 (Vsle) can be negative to further reduce the positive voltage on the erase gate FG 5 needed for erase. The magnitude of negative voltage Vwle and Vsle in this case is small enough not to forward the p/n junction.

The cell 10 is programmed, through a source side hot electron programming mechanism, by applying a high voltage on the coupling gate CG 7, a high voltage on the source line SL 2, a medium voltage on the erase gate EG 6, and a programming current on the bit line BL 9. A portion of electrons flowing across the gap between the word line WL 8 and the floating gate FG 5 acquire enough energy to inject into the floating gate FG 5 causing the floating gate FG 5 to be negatively charged, turning off the cell 10 in read condition. The resulting cell programmed state is known as '0' state.

The cell 10 can be inhibited in programming (if, for instance, another cell in its row is to be programmed but cell 10 is to not be programmed) by applying an inhibit voltage on the bit line BL 9. A split gate flash memory operation and various circuitry are described in U.S. Pat. No. 7,990,773, "Sub Volt Flash Memory System," by Hieu Van Tran, et al, and U.S. Pat. No. 8,072,815, "Array of Non-Volatile Memory Cells Including Embedded Local and Global Reference Cells and Systems," by Hieu Van Tran, et al, which are incorporated herein by reference.

With reference to FIG. 2, a pair 20 of split gate flash memory cells is depicted. It improves layout efficiency to fabricate flash memory cells in pairs as depicted in FIG. 2. Cell 41 comprises substrate 21, bit line 23, source line 22, word line 25, control gate 27, floating gate 29, and erase gate 31. Cell 42 comprises substrate 21, bit line 24, source line 22, word line 26, control gate 28, floating gate 30, and erase gate 31. Comparing the components of FIGS. 1 and 2, in terms of function, substrate 21 operates the same as substrate 1, bit line 23 and bit line 24 operate the same as bit line 9, source line 22 operates the same as source line 2, word line 25 and word line 26 operate the same as word line 8, control gate 27 and control gate 28 operate the same as control gate 7, floating gate 29 and floating gate 30 operate the same as floating gate 5, and erase gate 31 operates the same as erase gate 6. Cell 41 and cell 42 share erase gate 31 and source line 22, and therein is the layout efficiency.

Typical operating conditions for a pair of split gate memory cells of the type shown in FIG. 2 is shown in Table 1:

TABLE 1

|  | WL | | BL | | SL | | CG | | EG | |
| --- | --- | --- | --- | --- | --- | --- | --- | --- | --- | --- |
|  | Sel. | Unsel. | Sel. | Unsel. | Sel. | Unsel. | Sel. | Unsel. | Sel. | Unsel. |
| Erase | 0 V | 0 V | 0 V | 0 V | 0 V | 0 V | 0 V | 0 V | Vee | 0 V |
| Read | Vcc | 0 V | Vcc/2 | 0 V | 0 V | 0 V | Vcc | Vcc | 0 V | 0 V |
| Program | ~1.0 V | 0 V | 1 uA | Vcc | ~4.5 V | 0 V | Vpp | 0 V | 4.5 V | 0 V |

Table 1 depicts the operating voltages required to perform the Erase, Read, and Program functions. WL refers to word line 25 or word line 26, BL refers to bit line 23 or bit line 24, SL refers to source line 22, CG refers to control gate 27 or control gate 28, and EG refers to erase gate 31. "Sel." refers to a selected state, and "Unsel." refers to an unselected state. Examples of values for Vcc, Vpp, and Vee are Vcc=0.8V to ~5V, Vpp=3V to 20V, and Vee=3V to 20V.

A plurality of pairs of flash memory cells of the type shown in FIG. 2 can be arranged in two rows of cells. In FIG. 3, a first row comprises cell 101, cell 102, and cell 103. A second row comprises cell 111, cell 112, and cell 113. Cell 101 and cell 111 are pairs that follow the design of FIG. 2, and the same is true of cell 102 and cell 112, and of cell 103 and cell 113. Two rows comprising pairs of cells are referred to as a sector. In FIG. 3, sector 100 comprises cells 101, 102, 103, 111, 112, and 113. All cells in a given sector share a common source line and common erase gate. Thus, all cells in sector 100 can be erased using erase gate line 150, which is coupled to the erase gate 31 of each pair of memory cells. In FIG. 3, only six cells are shown for sector 100, but it is to be understood that a sector can include many more cells than just six.

One drawback of the prior art system is that all cells in a sector are erased at the same time. It is not possible to erase only a portion of a sector at a time. This drawback is particularly troublesome for applications such as smart cards that require a small sector size at the byte level.

What is needed is a system and method to inhibit the erasing of a portion of a sector of memory cells while allowing the remainder of the sector to be erased.

SUMMARY OF THE INVENTION

A system and method to inhibit the erasing of a portion of a sector of split gate flash memory cells while allowing the remainder of the sector to be erased is disclosed.

DETAILED DESCRIPTION OF THE PREFERRED EMBODIMENTS

Figure 3:
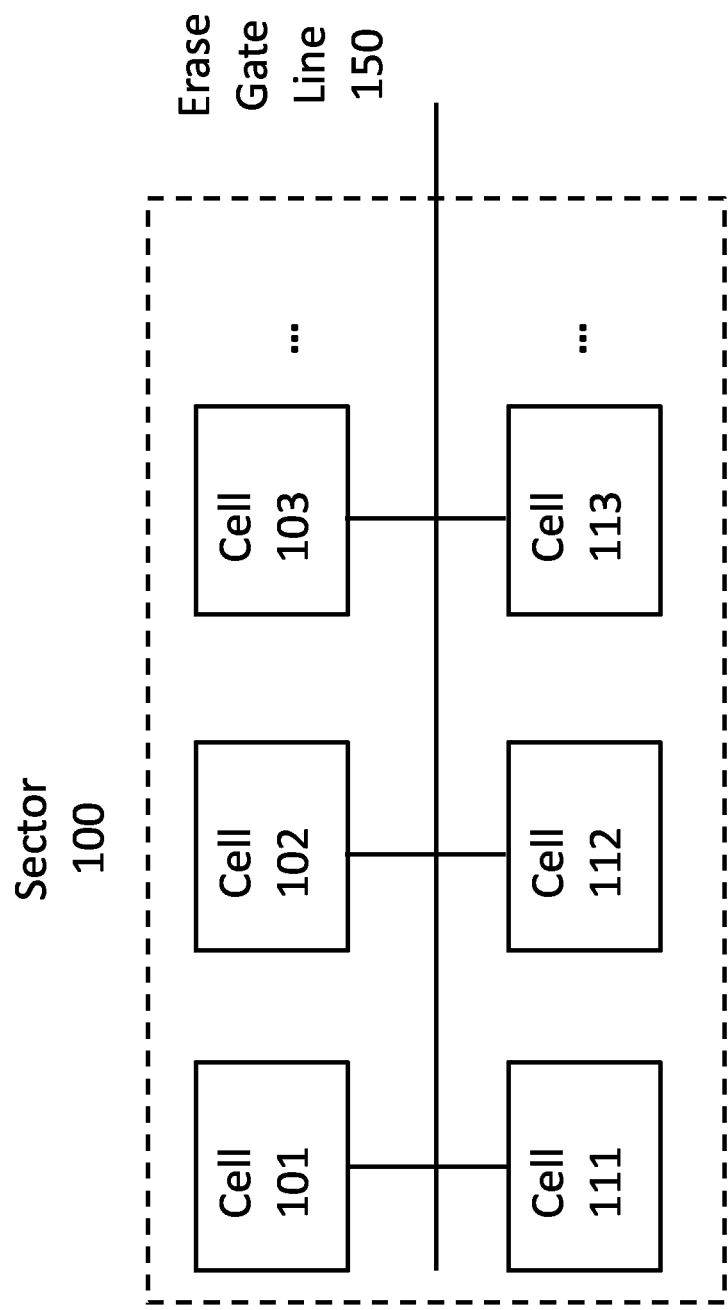
FIG. 3 depicts a prior art sector of split gate flash memory cells.
Figure 4:
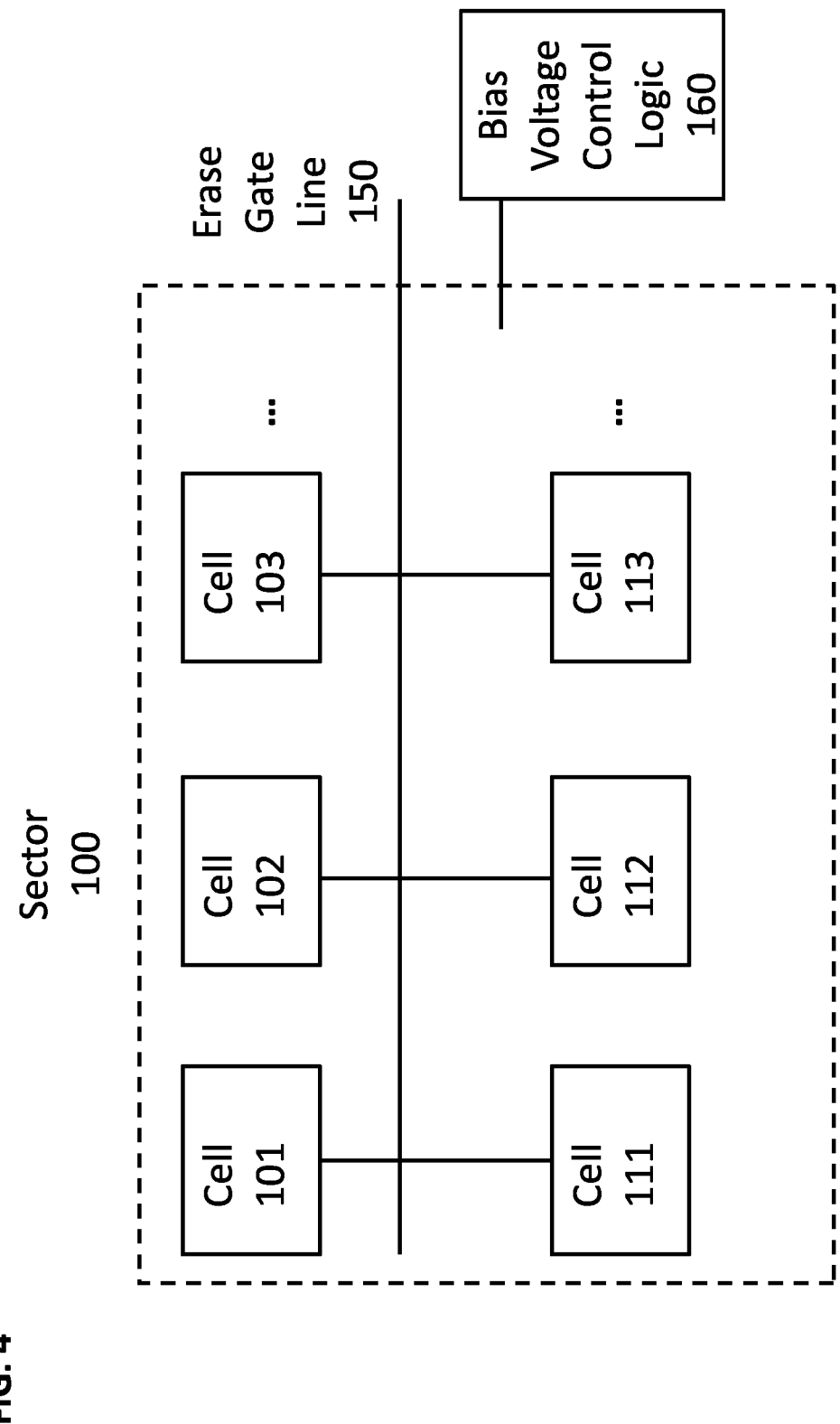
FIG. 4 depicts an embodiment that inhibits the erasing of a portion of a sector of split gate flash memory cells.

With reference to FIG. 4, an embodiment is depicted. The elements of FIG. 4 are largely the same as in FIG. 3, and the same numbers in each figure refer to the same element. In FIG. 4, however, bias voltage control logic 160 is selectively applied to certain terminals in one or more of cells 101, 102, 103, 111, 112, and 113 to inhibit the erasing of certain cells when erase gate line 150 is asserted during an erase operation.

Figure 1:
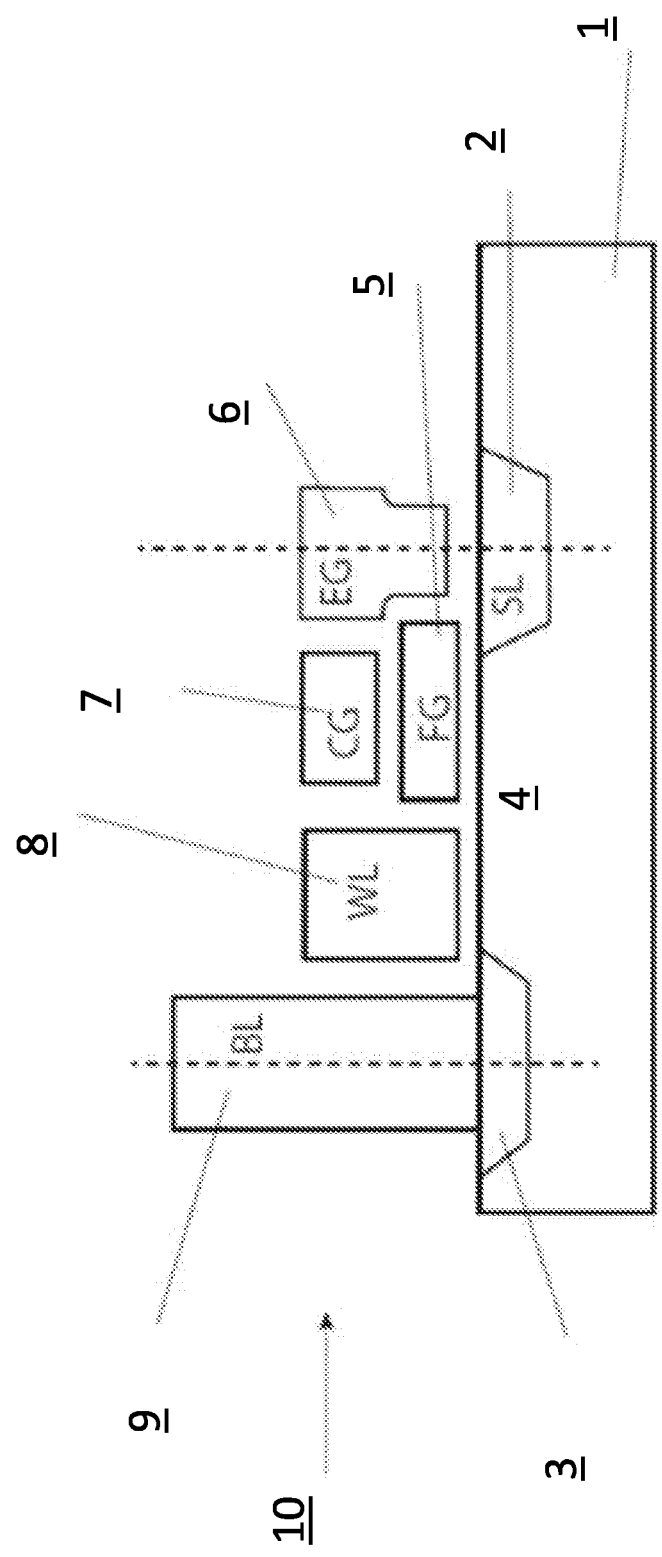
FIG. 1 depicts a prior art split gate flash memory cell.
Figure 2:
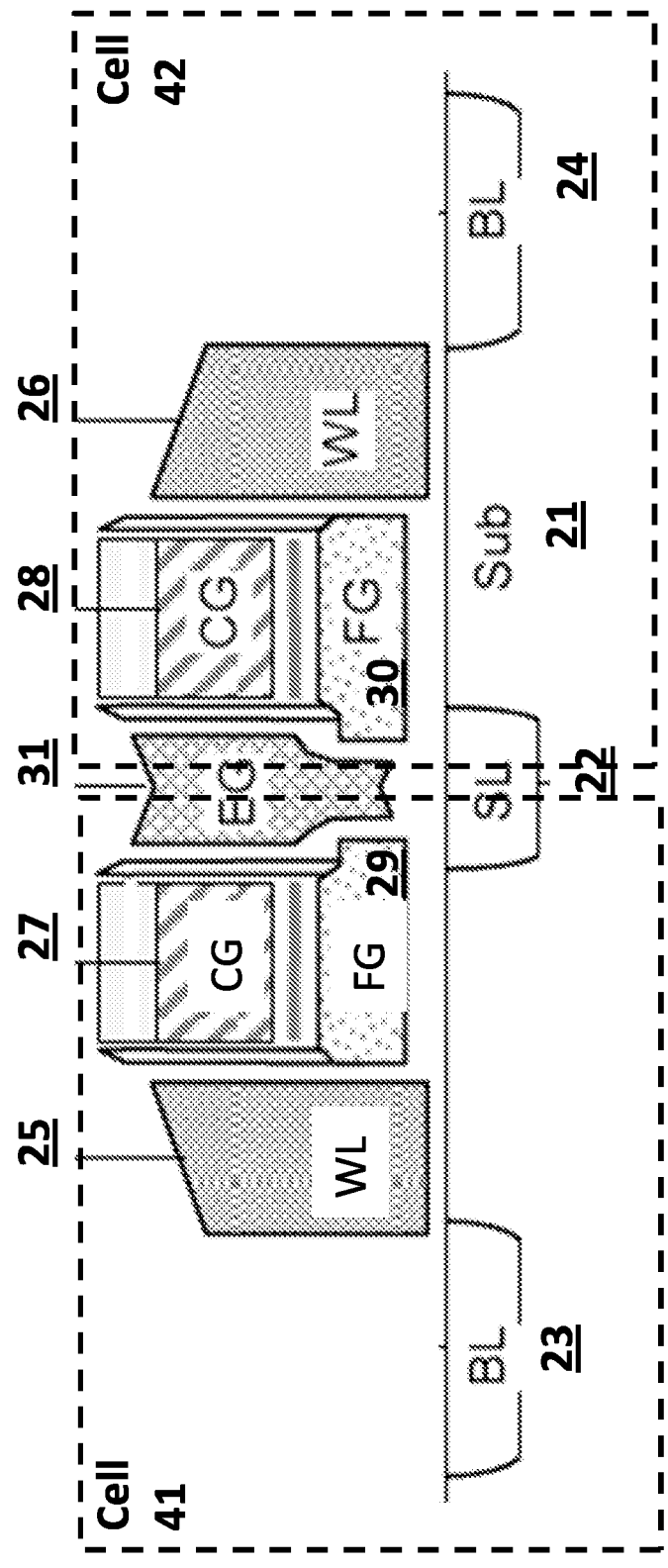
FIG. 2 depicts a prior art pair of split gate flash memory cells.
Figure 5:
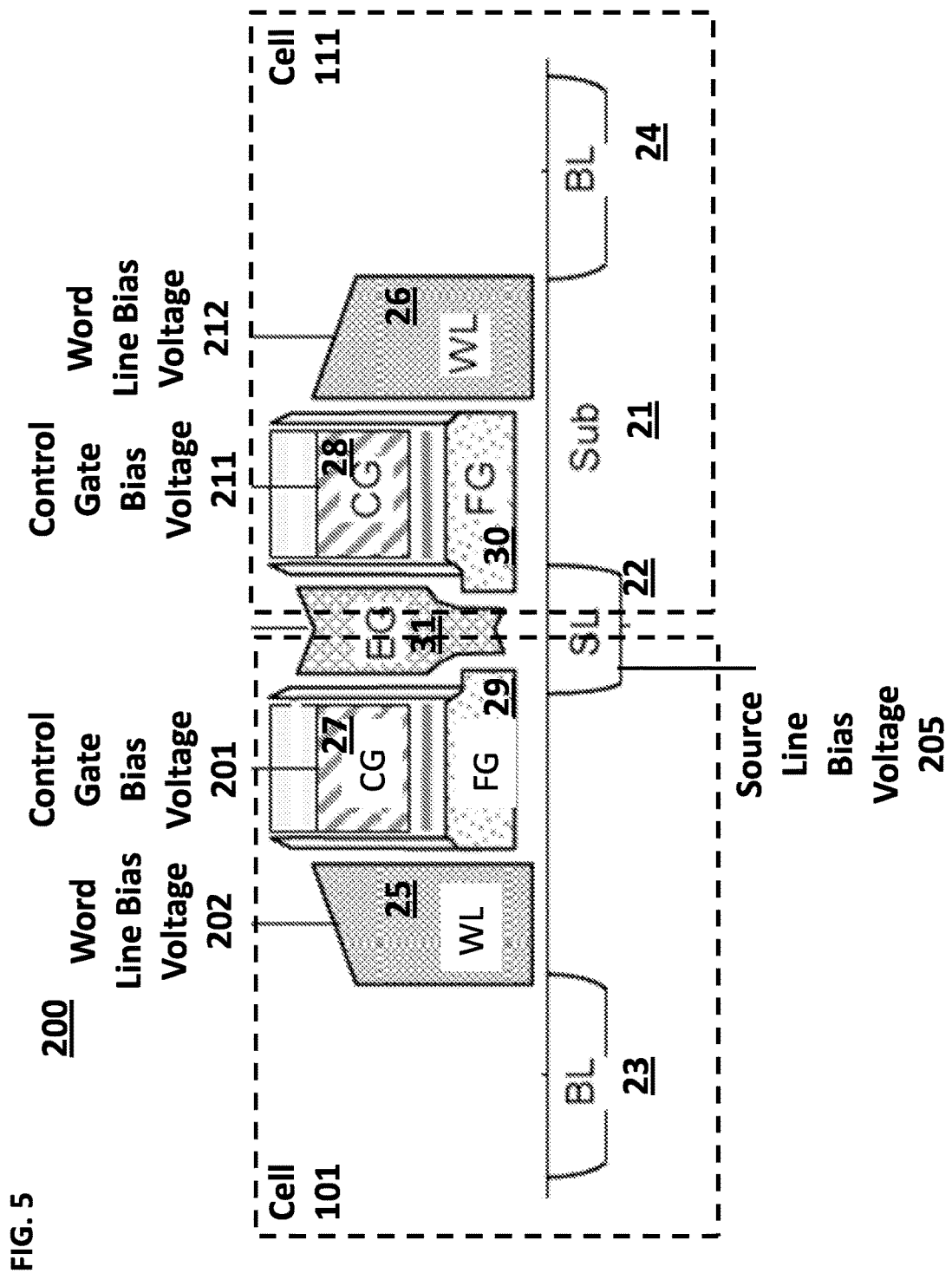
FIG. 5 depicts an embodiment of a pair of split gate flash memory cells with various connections for bias voltages.

Further detail is shown in FIG. 5, where an embodiment of a pair 200 of split gate memory cells is depicted. The elements of FIG. 5 are largely the same as in FIG. 2, and the same numbers in each figure refer to the same element. In FIG. 5, cell 101 and cell 111 are depicted as examples. It is to be understood that the same design can be used in all pairs of split gate memory cells. For example, in FIG. 4, cell 102 and cell 103 can follow the design of cell 101 in FIG. 5, and cell 112 and 113 can follow the design of cell 111 in FIG. 5. Thus, a sector comprising a first row of cells of the same type as cell 101 and a second row of cells of the same type as cell 111 can be created.

In FIG. 5, bias voltage control logic 160 is coupled to control gate 27 to selectively apply control gate bias voltage 201, to control gate 28 to selectively apply control gate bias voltage 211, to source line 22 to selectively apply source line bias voltage 205, to word line 25 to selectively apply word line bias voltage 202, and to word line 26 to selectively apply word line bias voltage 212.

Under the embodiment of FIG. 5, both cell 101 and cell 111 can be erased using erase gate 31 (as in the prior art). However, if it is desired to erase only cell 101 and not cell 111 (or more generally, to erase the row in which cell 101 is located but not the row in which cell 111 is located), then various configurations can be used to inhibit the erasing of cell 111 while allowing the erasing of cell 101.

In a first configuration, a bias voltage of Vee is applied as control gate bias voltage 211. One possible range for Vee is 7-20V. Thereafter, cell 101 can be erased using the values contained below in Table 2, but the application of Vee as control gate bias voltage 211 will inhibit the erasing of cell 111.

TABLE 2

|  | WL | | BL | | SL | | CG | | EG | |
| --- | --- | --- | --- | --- | --- | --- | --- | --- | --- | --- |
|  | Sel. | Unsel. | Sel. | Unsel. | Sel. | Unsel. | Sel. | Unsel. | Sel. | Unsel. |
| Erase | 0 V | 0 V | 0 V | 0 V | 0 V | 0 V | 0 V | Vee | Vee | 0 V |
| Read | Vcc | 0 V | Vcc/2 | 0 V | 0 V | 0 V | Vcc | Vcc | 0 V | 0 V |
| Program | ~1.0 V | 0 V | 1 µA | Vcc | ~4.5 V | 0 V | Vpp | 0 V | 4.5 V | 0 V |

In a second configuration, a bias voltage of Vee is applied as control gate bias voltage 211, and a bias voltage of around 0 to 3 V is applied to source line 22 as source line bias voltage 205. This allows a lower voltage to be used for erase gate 31 (Vee instead of around 9V). Cell 101 can be erased using the values contained below in Table 3, but the erasing of cell 111 will be inhibited.

TABLE 3

|  | WL | | BL | | SL | | CG | | EG | |
| --- | --- | --- | --- | --- | --- | --- | --- | --- | --- | --- |
|  | Sel. | Unsel. | Sel. | Unsel. | Sel. | Unsel. | Sel. | Unsel. | Sel. | Unsel. |
| Erase | 0 V | 0 V | 0 v or Vcc | 0 v or Vcc | ~4.5 V | 0 V | 0 V | Vee | Vee | 0 V |

TABLE 3-continued

| | WL | | BL | | SL | | CG | | EG | |
|---|---|---|---|---|---|---|---|---|---|---|
| | Sel. | Unsel. | Sel. | Unsel. | Sel. | Unsel. | Sel. | Unsel. | Sel. | Unsel. |
| Read | Vcc | 0 V | Vcc/2 | 0 V | 0 V | 0 V | Vcc | Vcc | 0 V | 0 V |
| Program | ~1.0 V | 0 V | 1 uA | Vcc | ~4.5 V | 0 V | Vpp | 0 V | 4.5 V | 0 V |

In a third configuration, a bias voltage of around 3 to ~20 V is applied as control gate bias voltage 211, a bias voltage of around −3 to ~−20 V is applied as control gate bias voltage 201, and a bias voltage of around 0V is applied to source line 22 as source line bias voltage 205. Cell 101 can be erased using the values contained below in Table 3, but the erasing of cell 111 will be inhibited.

TABLE 4

| | WL | | BL | | SL | | CG | | EG | |
|---|---|---|---|---|---|---|---|---|---|---|
| | Sel. | Unsel. | Sel. | Unsel. | Sel. | Unsel. | Sel. | Unsel. | Sel. | Unsel. |
| Erase | 0 V | 0 V | 0 V | 0 V | ~4.5 V to 0 V | 0 V | −3 V to −20 V | 3 V to 20 V | 3 V to ~20 V | 0 V |
| Read | Vcc | 0 V | Vcc/2 | 0 V | 0 V | Vcc | Vcc | Vcc | 0 V | 0 V |
| Program | ~1.0 V | 0 V | 1 uA | Vcc | ~4.5 V | 0 V | Vpp | 0 V | 4.5 V | 0 V |

In a fourth configuration, a bias voltage of around 9V is applied as control gate bias voltage 211, and a bias voltage of around −9V is applied as control gate bias voltage 201, and a bias voltage of Vcc is applied as word line bias voltage 212. One possible range for Vcc is 0.8 to ~5V. Cell 101 can be erased using the values contained below in Table 5, but the erasing of cell 111 will be inhibited.

TABLE 5

| | WL | | BL | | SL | | CG | | EG | |
|---|---|---|---|---|---|---|---|---|---|---|
| | Sel. | Unsel. | Sel. | Unsel. | Sel. | Unsel. | Sel. | Unsel. | Sel. | Unsel. |
| Erase | 0 V to Vcc | Vcc | 0 V | 0 V | 0 V | 0 V | ~3 V to ~20 V | 3 V to 20 V | 3 V to ~20 V | 0 V |
| Read | Vcc | 0 V | Vcc/2 | 0 V | 0 V | 0 V | Vcc | Vcc | 0 V | 0 V |
| Program | ~1.0 V | 0 V | 1 uA | Vcc | ~4.5 V | 0 ~0.5 V | Vpp | 0 V | 4.5 V | 0 V ~0.5 V |

Tables 2-5 depict the operating voltages required to perform the Erase, Read, and Program functions. WL refers to word line 25 or word line 26, BL refers to bit line 23 or bit line 24, SL refers to source line 22, CG refers to control gate 27 or control gate 28, and EG refers to erase gate 31. "Sel." refers to a selected state, and "Unsel." refers to an unselected state. Examples of values for Vcc, Vpp, and Vee are 0.8 to ~5V, 6 to ~20V and 6 to ~20V, respectively. It is to be understood that the configurations described above are exemplary only and that other configurations are possible, and that two or more of the configurations described above can be combined together.

The four configurations described above are based on the same principle. Whether a cell is erased depends upon the voltage potential between a floating gate and erase gate (for example, between floating gate 29 and erase gate 31 for cell 101, and floating gate 30 and erase gate 31 for cell 111). If the voltage potential is higher than the Fowler-Nordheim tunneling voltage, then an erase will happen. Otherwise, an erase will not happen. Thus, by applying the bias voltages described in the four configurations above, it is possible to selectively raise FG potential for an unselected row and inhibit the erasing of one cell while allowing the erasing of the other cell in the same pair. This can be used to inhibit the erasing of a row of cells within a sector while allowing the erasing of another row of cells within the same sector.

References to the present invention herein are not intended to limit the scope of any claim or claim term, but instead merely make reference to one or more features that may be covered by one or more of the claims. Materials, processes and numerical examples described above are exemplary only, and should not be deemed to limit the claims. It should be noted that, as used herein, the terms "over" and "on" both inclusively include "directly on" (no intermediate materials, elements or space disposed there between) and "indirectly on" (intermediate materials, elements or space disposed there between) Likewise, the term "adjacent" includes "directly adjacent" (no intermediate materials, elements or space disposed there between) and "indirectly adjacent" (intermediate materials, elements or space disposed there between). For example, forming an element "over a substrate" can include forming the element directly on the substrate with no intermediate materials/elements there between, as well as forming the element indirectly on the substrate with one or more intermediate materials/elements there between.

What is claimed is:

1. A method of erasing a portion of a sector of a flash memory system, the sector comprising a first row of flash memory cells and a second row of flash memory cells, wherein the first row and second row share an erase gate, comprising:

applying a first non-zero bias voltage to a control gate for the first row, wherein the first non-zero bias voltage is around 9 volts;

applying a second non-zero bias voltage to a control gate for the second row, wherein the second non-zero bias voltage is around −9 volts;

applying a third non-zero bias voltage to a word line for the second row, wherein the third non-zero bias voltage is within the range of 0.8 to 5 volts; and applying a signal to the erase gate to erase the first row while not erasing the second row.

2. The method of claim 1, wherein the first row of flash memory cells and the second row of flash memory cells each comprise split gate flash memory cells.

\* \* \* \* \*